(12) United States Patent
Norman

(10) Patent No.: US 8,064,256 B2
(45) Date of Patent: Nov. 22, 2011

(54) NON-VOLATILE FIFO WITH THIRD DIMENSION MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 33 days.

(21) Appl. No.: 12/592,314

(22) Filed: Nov. 23, 2009

(65) Prior Publication Data

US 2010/0220527 A1 Sep. 2, 2010

Related U.S. Application Data

(60) Provisional application No. 61/208,933, filed on Mar. 2, 2009.

(51) Int. Cl.
*G11C 14/00* (2006.01)
(52) U.S. Cl. ............. 365/185.08; 365/185.05; 365/51; 365/189.15; 365/189.16
(58) Field of Classification Search ............ 365/185.05, 365/51, 189.15, 189.16, 185.08, 189.161
See application file for complete search history.

(56) References Cited

U.S. PATENT DOCUMENTS

| | | | | |
|---|---|---|---|---|
| 4,809,225 A | * | 2/1989 | Dimmler et al. ............ 365/149 |
| 5,548,228 A | * | 8/1996 | Madurawe ................. 326/41 |
| 5,892,712 A | * | 4/1999 | Hirose et al. ............ 365/185.07 |
| 7,042,792 B2 | * | 5/2006 | Lee et al. ................ 365/230.05 |
| 7,327,600 B2 | | 2/2008 | Norman |
| 7,372,753 B1 | | 5/2008 | Rinerson et al. |
| 7,623,404 B2 | * | 11/2009 | Manickavasakam et al. 365/226 |
| 7,751,221 B2 | | 7/2010 | Norman |
| 2004/0170040 A1 | | 9/2004 | Rinerson et al. |
| 2006/0171200 A1 | | 8/2006 | Rinerson et al. |
| 2009/0016094 A1 | | 1/2009 | Rinerson et al. |

* cited by examiner

*Primary Examiner* — Connie Yoha

(57) ABSTRACT

A FIFO with data storage implemented with non-volatile third dimension memory cells is disclosed. The non-volatile third dimension memory cells can be fabricated BEOL on top of a substrate that includes FEOL fabricated active circuitry configured for data operations on the BEOL memory cells. Other components of the FIFO that require non-volatile data storage can also be implemented as registers or the like using the BEOL non-volatile third dimension memory cells so that power to the FIFO can be cycled and data is retained. The BEOL non-volatile third dimension memory cells can be configured in a single layer of memory or in multiple layers of memory. An IC that includes the FIFO can also include one or more other memory types that are emulated using the BEOL non-volatile third dimension memory cells and associated FEOL circuitry configured for data operations on those memory cells.

19 Claims, 13 Drawing Sheets

NON-VOLATILE FIFO WITH THIRD DIMENSION MEMORY

CROSS-REFERENCE TO RELATED APPLICATIONS

This application is related to U.S. patent application Ser. No. 11/095,026, filed Mar. 30, 2005, published as U.S. Pub. No. 2006/0171200, and entitled "Memory Using Mixed Valence Conductive Oxides," which is herein incorporated by reference in its entirety and for all purposes.

FIELD OF THE INVENTION

The present invention relates generally to semiconductors and memory technology. More specifically, present invention relates to a FIFO using third dimensional non-volatile memory cells.

BACKGROUND

First In-First Out (FIFO) memory devices are used to solve many problems in electrical systems. One key use for FIFO's is as a speed matching buffer between two different time domains where one time domain is running at a different clock rate than another time domain, for example. Presently FIFO designs are made from SRAM cells. FIG. 1 depicts a conventional SRAM cell 100. Two back to back inverters (101, 103) act as the storage element of the cell 100 and two steering transistors (102, 104) serve as gating logic to the bit lines 106 and 107 that are denoted as Bit and Bit*, respectively. Bit and Bit* are used to pass data values during reads and writes to the cell 100. The logic value applied to the Bit line 106 is the inverse of the logic value applied to the Bit* line 107. The steering transistors (102, 104) are enabled by a Word_Line 109 that is electrically coupled with an address decoder (not shown) which activates the steering transistors (102, 104) by driving an appropriate logic value and/or voltage on word line 109, for example. The cell 100 depicted in FIG. 1 works well for SRAM applications, but falls short of the requirements needed for a FIFO. In a FIFO, both an input port and an output port need to be able to access memory locations in the FIFO (e.g., memory cells) at the same time, with the only limit being not to simultaneously access the same memory cell at the same time. To accomplish this, another access port is required, one for reading data from the FIFO and one for writing data to the FIFO.

Reference is now made to FIG. 2 where the aforementioned task is accomplished by adding another access set of transistors. In FIG. 2, a conventional SRAM cell 200 includes back to back inverters (201, 203) which serve as the storage element of the cell 200, steering transistors (202, 204) which are electrically coupled with Word_Line_A 209 and Bit_A and Bit_A* lines (205, 207), and steering transistors (206, 208) which are electrically coupled with Word_Line_B 215 and Bit_B and Bit_B* lines (211, 213). In cell 200, Word_Line_A 209 or Word_Line_B 215 can be activated for equal access of the memory holding register (back to back inverters 201 and 203). In the structure depicted in FIG. 2 the A port has access by enabling the A word line 209 and driving or sensing the A bit line pair (Bit_A 205 and Bit_A* 207) The B port, likewise, can get access by activating the B word line 215 and sensing the B bit line pair (Bit_B 211 and Bit_B* 213).

Turning now to FIG. 3, in a conventional FIFO architecture 300, data is input to a SRAM memory array 301 on one side and output from the array 301 on the other side. Each port has control signals for writing (Wr_F, Wr_WL) or reading (Rd_F, Rd_WL). Typical of the write port is a counter/decoder 303 that receives a write enable signal Wr_En and a write clock signal Wr_Clk. In some designs free running clocks are used and data is only clocked in when the write enable goes active. In other designs where the clock is gated, a write enable signal is held active, allowing the gated clock (e.g., strobe) to load incoming data. Subsequently, the incoming write data is loaded into memory at the location being pointed to by the word line. The word line is typically generated in 1 of 2 ways. The first way is to use a counter that drives a decoder (e.g., counter & decoder 303) that decodes a unique value (word line) for the counter value. The word line, in combination with the clock (e.g., Wr_CLK) and write enable (e.g., Wr_En) generates a pulse on the decoded word line (e.g., Wr_WL). The data resident on the bit lines are gated to the cell and drive the holding register (e.g., the aforementioned back-to-back inverters) to the desired state. The bit line being driven low is the key signal for determining if the data value for a logic "1" or a logic "0" is being written. A low on the Bit or Bit* will determine the value of data to be stored.

FIG. 4 depicts a more detailed path for writing data to a conventional FIFO. The schematic depicted in FIG. 4 is essentially the write portion of the schematic depicted in FIG. 3. As can be seen in FIG. 4, most designs operate with some sort of pre-charge circuitry. This can be done by several ways. The three transistors (418, 420, 422) connected between the bit lines (Bit_A, Bit_A*) perform this function. When a write command is received, as indicated by the interface control signals (Wr_En, Wr_Clk), a pre-charge pulse Wr_Pre_Charge is generated by counter 411. The Wr_Pre_Charge pulse turns on the three transistors (418, 420, 422) which drive each line (Bit_A, Bit_A*) to a positive voltage and the transistor 422 between the bit lines (Bit_A, Bit_A*) is turned on to equalize the values between the two bit lines (Bit_A, Bit_A*). With the pre-charge in place, one or more of the word lines (Wr_A0, Wr_A1, Wr_A2, ... Wr_An) are enabled such that data values on Wr_Data are gated to one or more of the memory cells (421, 423, 425, ... n) which store the values on the bit lines (Bit_A, Bit_A*). In many designs the pre-charge is on, forcing a pre-charge, and turned off at the start of the write, allowing data drivers to force their value.

The read functions much like the write. The interface is typically controlled by a read enable and a clock and the memory array outputs data from the memory array. The read data is accessed at the location pointed to by the read counter and read decoder, as was described above for the write function.

FIG. 5 depicts in greater detail the read path discussed above in FIG. 3. A read operation to the conventional FIFO activates the read enable Rd_En and the read clock Rd_Clk which starts a simple sequence in the memory. A read pre-charge Rd_Pre_Charge is generated that typically sets the bit lines (Bit_B, Bit_B*) to a high level using transistors 518 and 520 between bit lines (Bit_B, Bit_B*) and transistor 522 for equalization. One or more word lines (Rd_A0, Rd_A1, Rd_A2, ... Rd_An) for the decoded address is then pulsed and contents of one or more cells (521, 523, 525, ... n) are then gated out onto the read bit lines (Bit_B, Bit_B*). The value gated onto the bit lines (Bit_B, Bit_B*) is then sent to a sense amplifier 535 for amplification and then output from the device as the read data Rd_Data. Optionally, there may be a multiplexer 531 between the bit lines (Bit_B, Bit_B*) and the sense amplifier 535. This will be determined by array layout. If parallel cells are designed for a better aspect ratio, the decoders will decode this and steer the selected column to the sense amplifier. The pre-charge is active and then is turned off as the word line turns on. This will place the bit lines at a known starting point and the value read out will switch faster from the known center line, giving a faster readout.

The above described conventional FIFO implementations use counters and decoders as the addressing methodology. An alternate conventional FIFO implementation 600 is depicted in FIG. 6. In FIG. 6 a pair of ring counters 620 and 640 for a write path and read path respectively, are depicted. The ring counters (620, 640) act by passing a "1" around a register loop formed by a series of flip-flops that are clocked by Wr_Clk and Rd_Clk and enabled by Wr_En and Rd_En. The register loop with the "1" is pointing to a particular word line (Wr_A0, Wr_A1, Wr_A2, . . . Wr_An for the write path and Rd_A0, Rd_A1, Rd_A2, . . . Rd_An for the read path). Each register output is a word line enable for the write path (620) and the other ring counter acts as a word line enable for the read path (640) word lines. The conventional ring counter methodology typically requires more logic than the above described counter and decoder methodology, but it is faster as the shift time occurs faster than the counter decoder allowing for faster interface operation, back to back.

We have described data operations on conventional FIFO's. Now a few usage details will be described. At power up, the read and write counters or ring counters are initialized to the same vale. As depicted in FIG. 3, the FIFO 300 has compare logic 307 used for management between the two counters (303, 305). When the write and read address are the same the compare logic 307 will detect the identical addresses and output an empty signal Empty to a read interface (not shown) that is electrically coupled with Empty. This will be used by the read port to tell it that no data is valid in the FIFO 300 and that no read should be done.

A Full flag electrically coupled with the write port will be inactive, indicating to the write port that it is ok to write into the memory. When a write occurs the write data is loaded into the first address and the counter increments. The two counters (303, 305) are now not equal and the empty signal Empty will go inactive. This tells the read port that valid data is present and can be read. When this data is read, the read counter is advanced. If no further write has occurred, then the two counters (303, 305) are equal and the empty flag Empty is again asserted and goes active. If the read port is busy and is not reading data the write port can continue to enter data. Data operations on the FIFO can continue until the write address is one (1) less than the read address (it has filled the FIFO and rolled over the address to start anew). Subsequently, the compare logic 307 will detect a full state in the FIFO 300 and activate the full flag Full. Activating the Full flag signals the write port to stop writing data. As soon as the read port reads the next address the FIFO will deactivate the Full flag and write operations are allowed to continue. A system using the conventional SRAM based FIFO can use these flags (Empty, Full) in the manner described to send data between two different time domains.

The conventional FIFO described above has served the market well, but it is based on the non-volatile SRAM cell design. Although SRAM cells are fast they require large die sizes, are non-volatile, and lose their data contents on loss of power. This complicates many applications and requires costly, heavy, and large battery backup systems to retain data after power loss. There are continuing efforts to improve FIFO technology.

BRIEF DESCRIPTION OF THE DRAWINGS

The invention and its various embodiments are more fully appreciated in connection with the following detailed description taken in conjunction with the accompanying drawings, in which.

Figure 1:
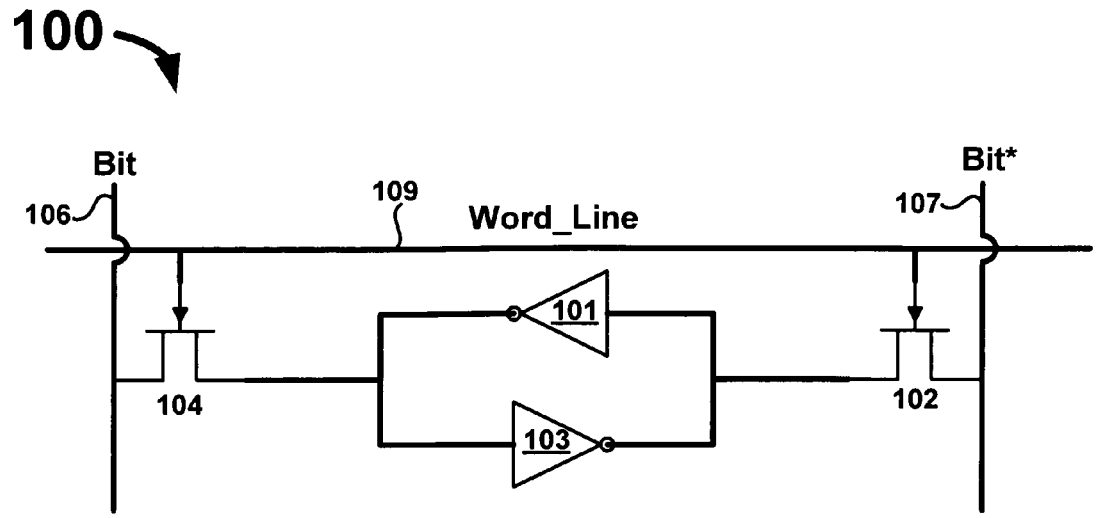
FIG. 1 depicts a schematic of a conventional FIFO SRAM cell.

Although the previous drawings depict various examples of the invention, the invention is not limited by the depicted examples. It is to be understood that, in the drawings, like reference numerals designate like structural elements. Also, it is understood that the depictions in the described drawings are not necessarily drawn to scale.

DETAILED DESCRIPTION

In some examples, techniques such as those described herein enable implementation of a non-volatile FIFO and optionally, implementation of a non-volatile FIFO as well as emulation of one or more additional memory types (e.g., DRAM, FLASH, SRAM, ROM) on a single component such as a wafer, substrate, or die. U.S. patent application Ser. No. 11/095,026, filed Mar. 30, 2005, published as U.S. Pub. No. 2006/0171200 and entitled "Memory Using Mixed Valence Conductive Oxides," and hereby incorporated by reference in its entirety for all purposes, describes non-volatile third dimensional memory cells that may be arranged in a two-terminal, cross-point memory array that can be configured as a single layer of cross-point memory or as multiple vertically stacked layers of cross-point memory. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier in contact with a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen perovskites and lanthanum-nickel-oxygen perovskites) change valence, their conductivity changes. Additionally, oxygen accumulation in certain electrolytic tunnel barriers (e.g., yttrium stabilized zirconia) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts. Unlike FLASH non-volatile memory, an array (e.g., a cross-point array) including a plurality of the non-volatile memory elements can be written without a preceding erase operation (e.g., a block erase operation). Therefore, the latency associated with having to perform a block erase operation prior to a write operation is eliminated allowing for faster write times.

In some embodiments, an electrolytic tunnel barrier and one or more mixed valence conductive oxide structures do not need to operate in a silicon substrate, and, therefore, can be fabricated (e.g., back-end-of-the-line BEOL) above circuitry (e.g., circuitry for data operations fabricated front-end-of-the-line FEOL). Further, a two-terminal memory cell can be arranged in a cross-point array such that one terminal is electrically coupled with an X-direction line (or an "X-line") and the other terminal is electrically coupled with a Y-direction line (or a "Y-line"). A third dimensional memory can include multiple memory cells vertically stacked upon one another, sometimes sharing X-direction and Y-direction lines in a layer of memory, and sometimes having isolated lines. When a first write voltage, VW1, is applied across the memory cell (e.g., by applying ½ VW1 to the X-direction line and ½-VW1 to the Y-direction line), the memory cell can switch to a low resistive state. When a second write voltage, VW2, is applied across the memory cell (e.g., by applying ½ VW2 to the X-direction line and ½-VW2 to the Y-direction line), the memory cell can switch to a high resistive state. Memory cells using electrolytic tunnel barriers and mixed valence conductive oxides can have VW1 opposite in polarity from VW2.

Accordingly, the memory cells based on non-volatile memory can be fabricated BEOL over circuitry previously fabricated FEOL on a substrate (e.g., a silicon—Si wafer). A FEOL inter-level interconnect structure can be used to electrically couple the BEOL memory cells with the FEOL circuitry in the substrate below. Furthermore, the memory cells can be fabricated along with a two-terminal cross-point memory array that is fabricated BEOL above the aforementioned FEOL circuitry positioned on the substrate below. The FEOL circuitry fabricated on the substrate below (e.g., CMOS circuitry) can include circuitry for performing data operations (e.g., read, write, program, and erase) on two-terminal memory cells positioned in the two-terminal cross-point memory array and operative to store data as a plurality of conductivity profiles. The same or different FEOL circuitry can be used to access the memory cells. The memory cells can be used solely as memory cells for a non-volatile FIFO, or the memory cells can serve as random access memory (RAM) used for emulating one or more memory types such as DRAM, SRAM, ROM, and FLASH and also serve as registers or cells for a non-volatile FIFO, such that one integrated circuit includes memory operative as both a FIFO and as one or more other memory types.

Figure 2:
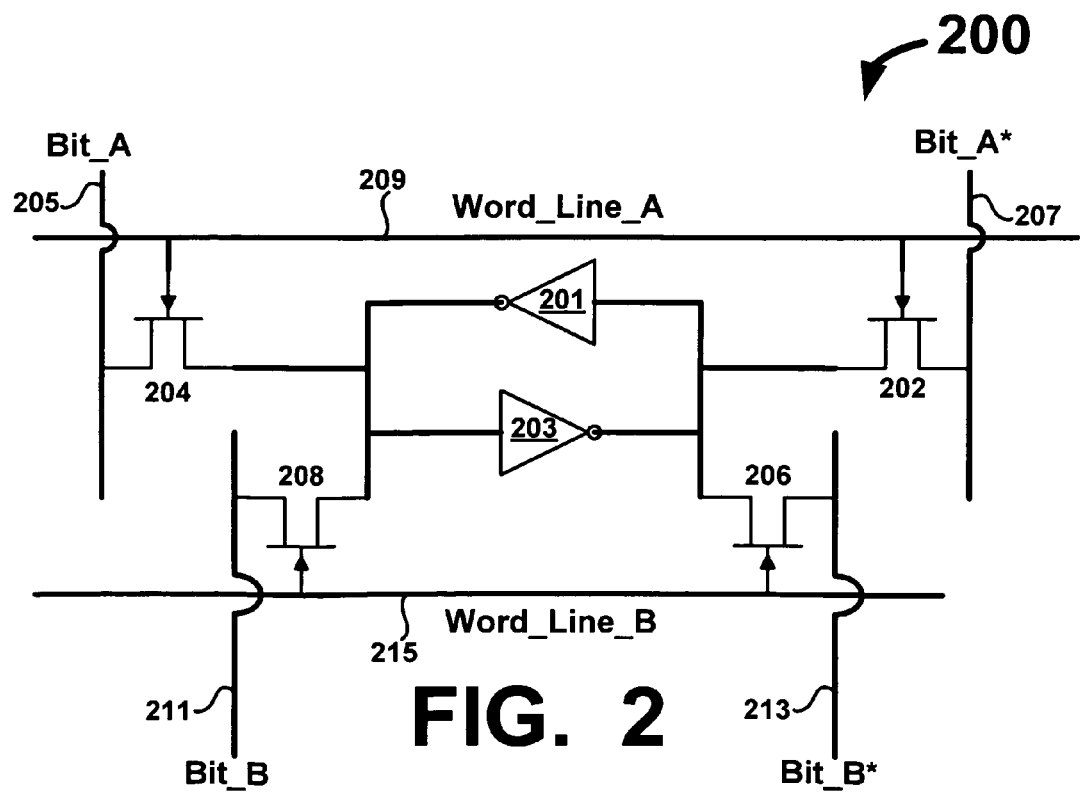
FIG. 2 depicts a schematic of a conventional dual-port FIFO SRAM cell.
Figure 3:
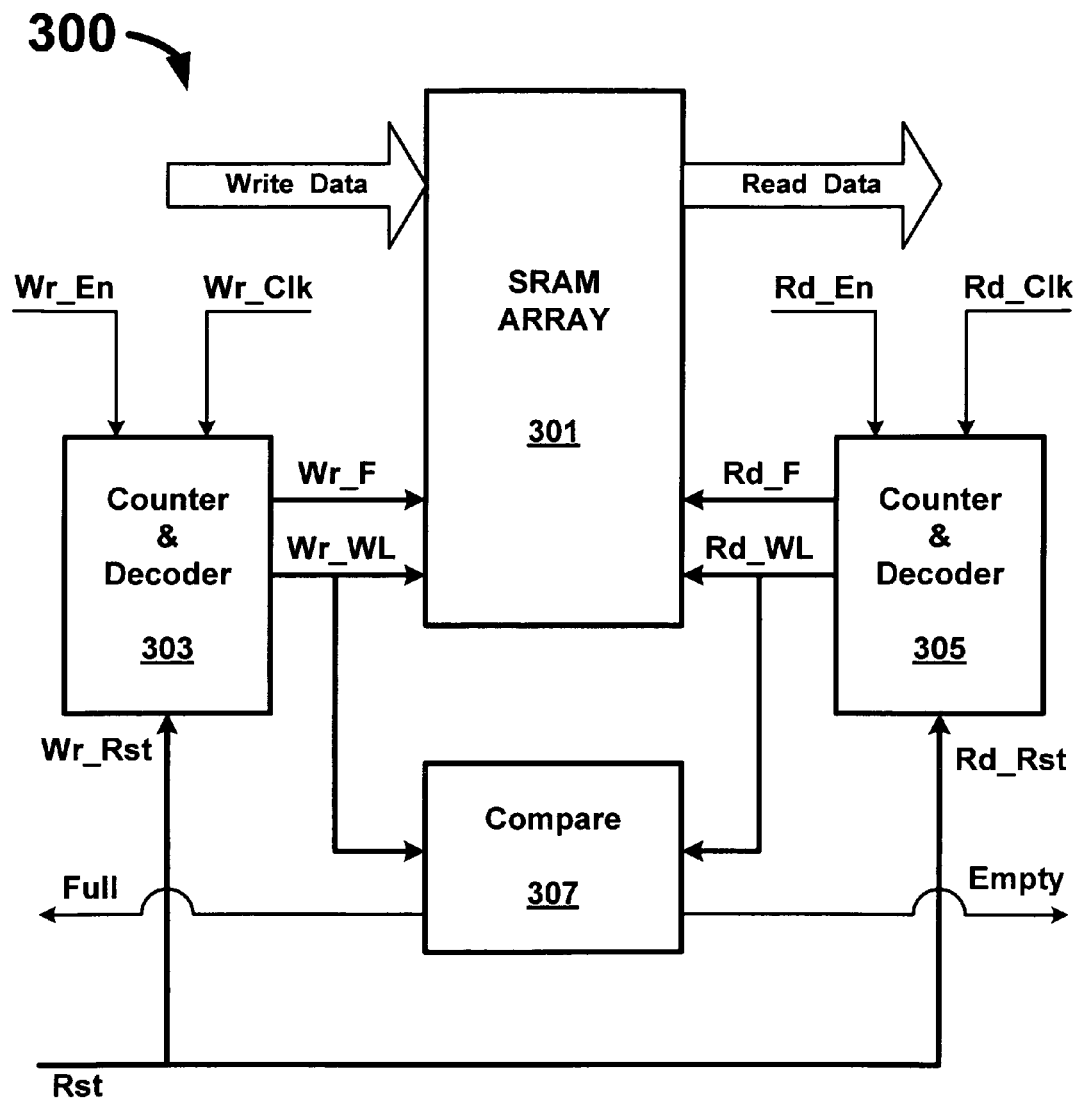
FIG. 3 depicts a schematic of a conventional FIFO architecture.
Figure 4:
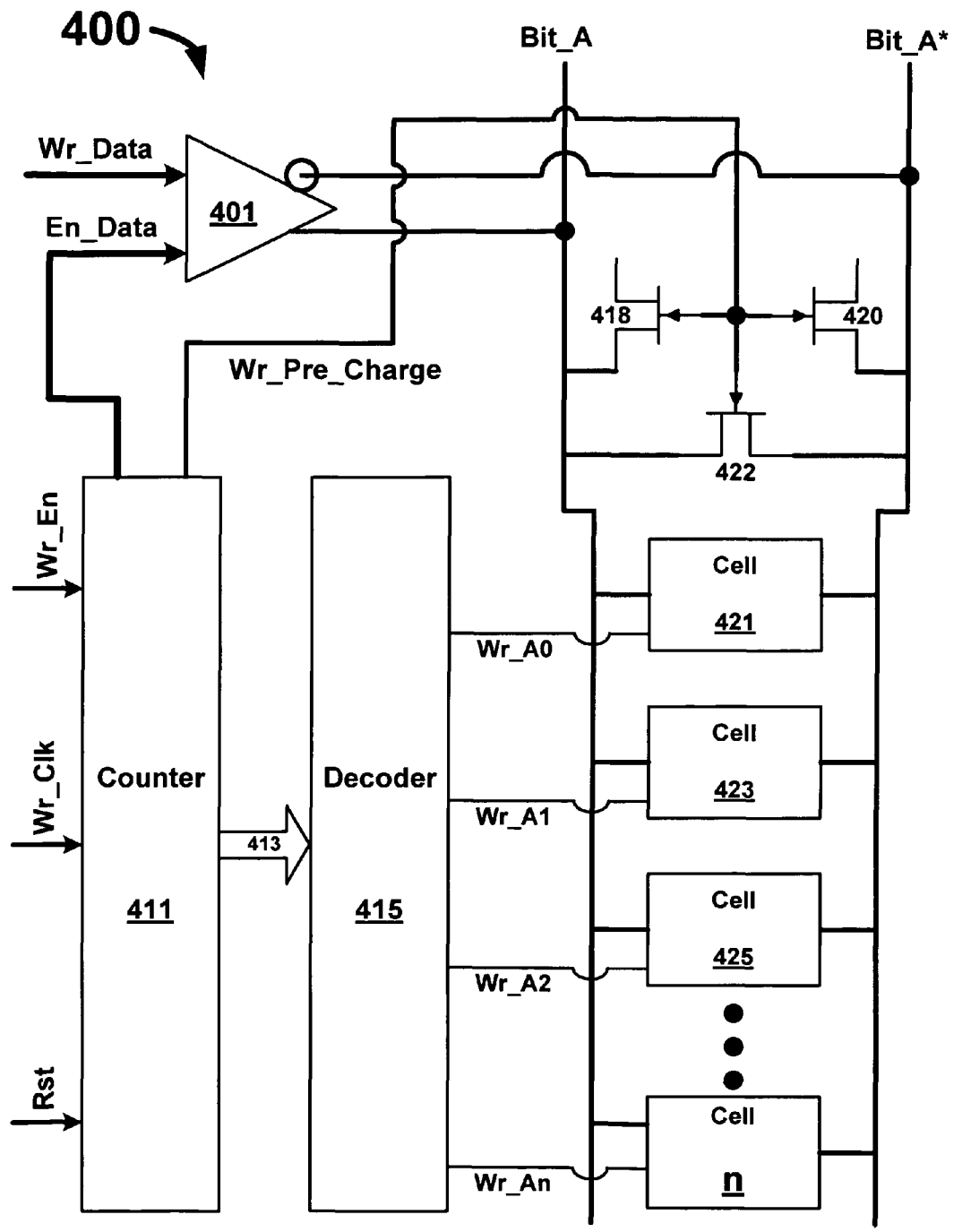
FIG. 4 depicts a schematic of a write path for a conventional FIFO.
Figure 5:
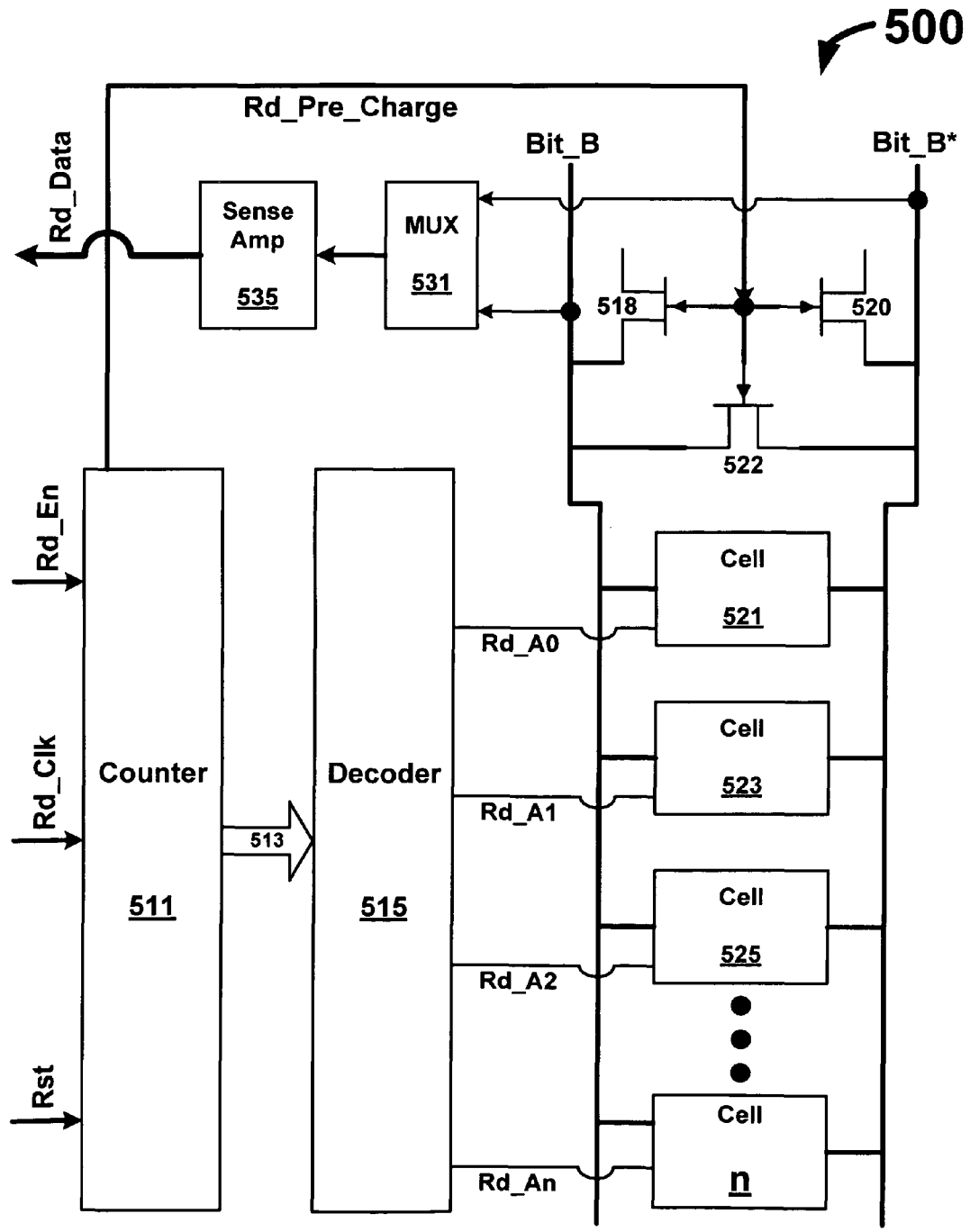
FIG. 5 depicts a schematic of a read path for a conventional FIFO.
Figure 6:
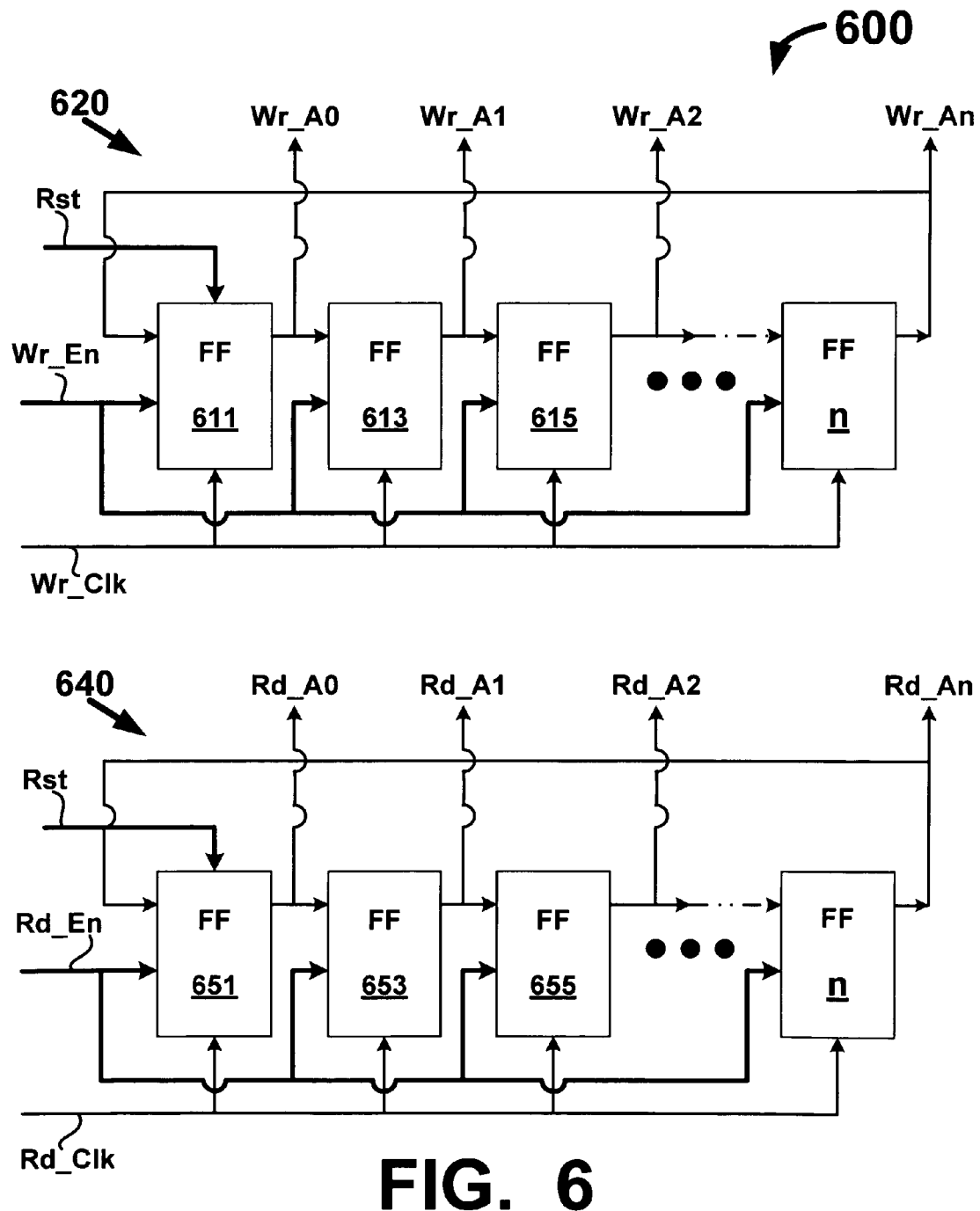
FIG. 6 depicts a schematic of a ring counter architecture for a conventional FIFO.
Figure 7:
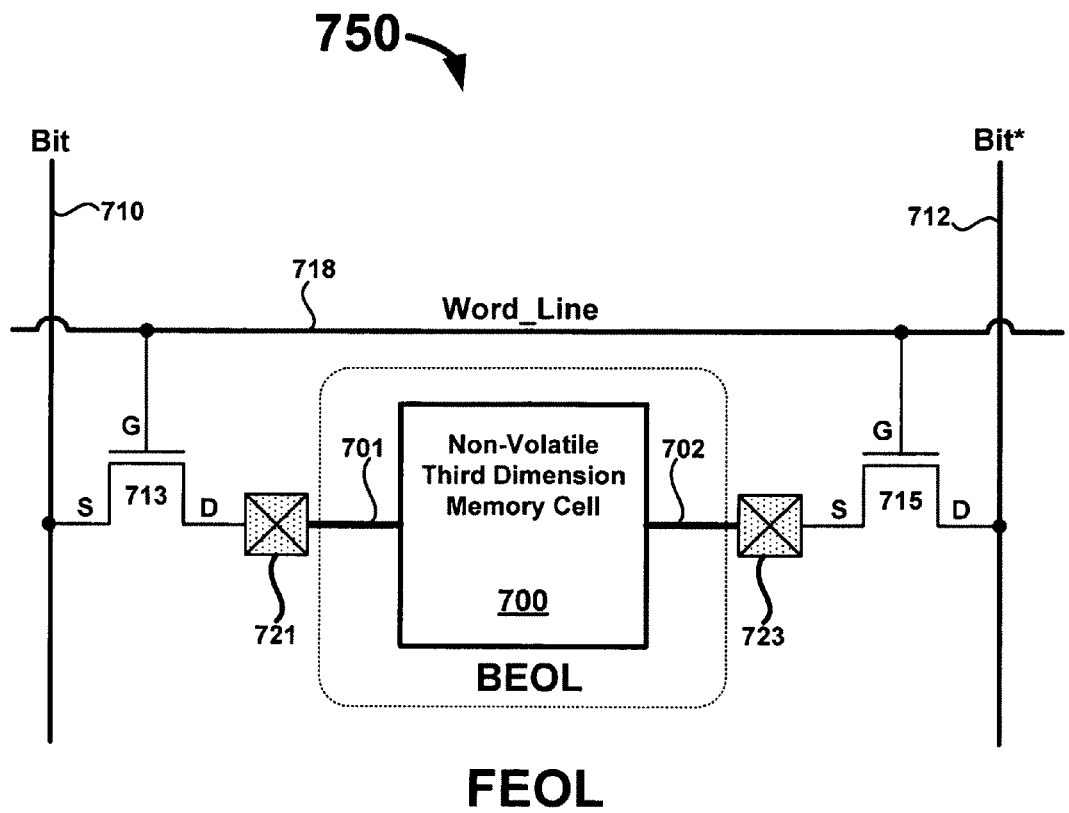
FIG. 7 depicts a schematic of a non-volatile FIFO register based on a non-volatile third dimension memory cell.

FIG. 7 depicts a basic cell structure 750 including a non-volatile third dimensional memory cell 700 for use in a non-volatile FIFO (NV-FIFO) memory. The memory cell 700 is electrically in series with a first terminal 701 and a second terminal 702. The memory cell 700 can include a two-terminal memory element (not shown) with the two terminals of the memory element electrically in series with the terminals (701, 702). In the example depicted, the conventional inverter latch (e.g., register of FIGS. 1 and 2) has been replaced by the non-volatile third dimensional memory cell 700. The memory cell 700 is fabricated above and is positioned above a logic plane (not shown) that includes active circuitry and logic (e.g., transistors 713 and 715) that is electrically coupled with the non-volatile third dimensional memory cell 700. Although only one cell 700 is depicted, a NV-FIFO incorporating the non-volatile third dimensional memory cell 700 would typically contain a plurality of the BEOL cells 700 and their associated FEOL circuitry. Circuitry in the logic plane is electrically coupled with the non-volatile third dimensional memory cell 700 using an inter-level interconnect structure, such as vias 721 and 723, for example. The Word_Line 718, the bit lines (Bit 710 and Bit* 712), and transistors (713, 715) are fabricated FEOL on a substrate (e.g., on a silicon—Si wafer). After the FEOL processing is completed, one or more layers of third-dimension memory are fabricated BEOL above the logic plane to form the non-volatile third dimensional memory cells 700 and electrically conductive structures operative to electrically couple the non-volatile third dimensional memory cells 700 with the active circuitry in the logic plane. The electrically conductive structures can be array lines with each non-volatile third dimensional memory cell 700 positioned at an intersection of a first conductive array line (e.g., an X-direction array line) with a second conductive array line (e.g., a Y-direction array line). In some applications the first and second array lines will be arranged substantially orthogonal to one another (e.g., as in a cross-point array configuration).

As described above, there is a need for simultaneous access to a NV-FIFO array, so the structure depicted in FIG. 7 is expanded into a dual ported cell structure that provides dual ported access. The dual ported structure is depicted in FIG. 8, a write path for the dual ported structure is depicted in FIG. 9, and a read path is depicted in FIG. 10.

Figure 8:
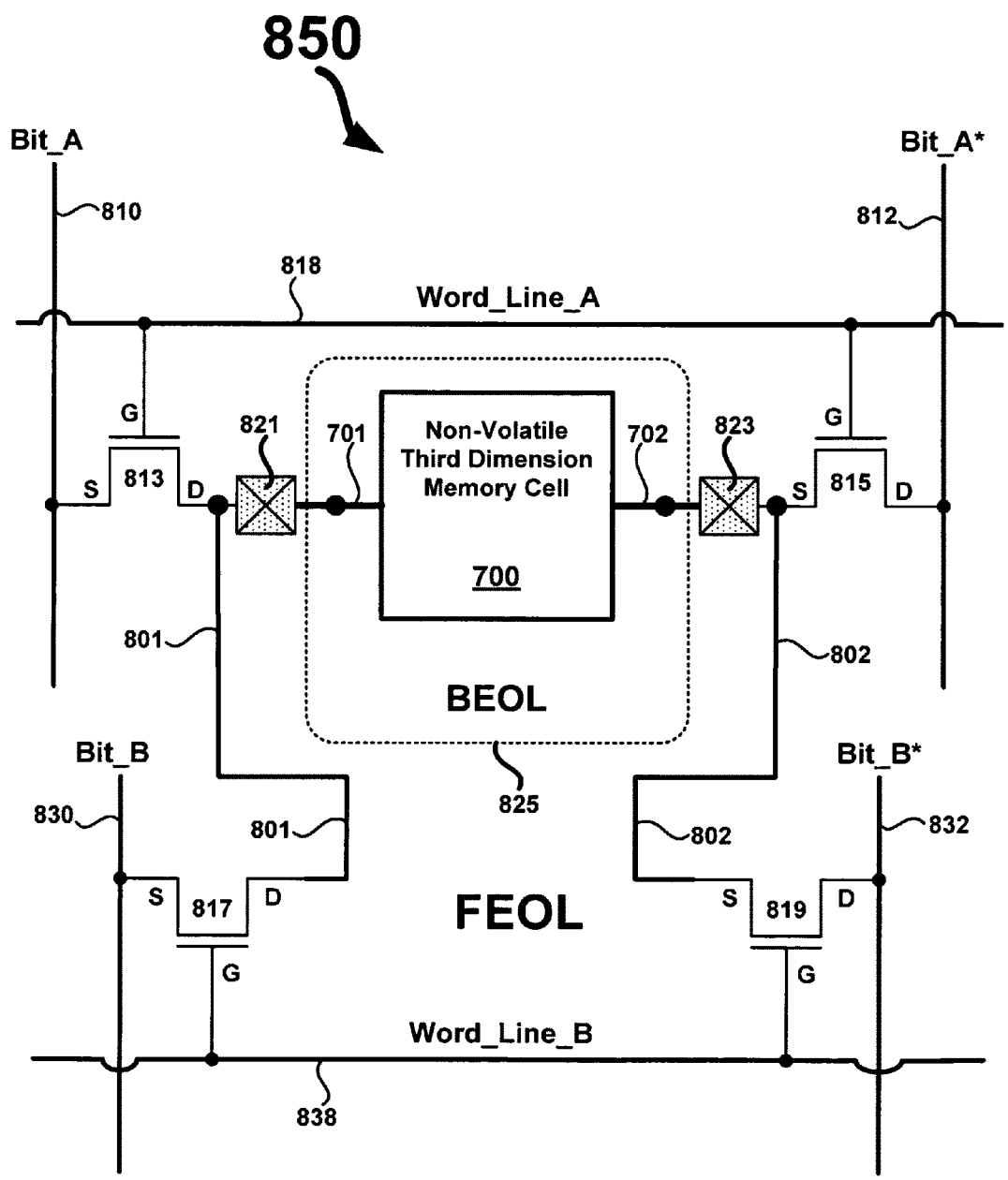
FIG. 8 depicts a schematic of non-volatile dual-port FIFO register based on a non-volatile third dimension memory cell.

Referring now to FIG. 8, transistors 813 and 815 electrically couple Word_Line_A 818 and bit lines (Bit_A 810 and Bit_A* 812) with cell 700 through vias 821 and 823. Cell 700 is positioned in a BEOL portion 825; whereas, the transistors are positioned in a FEOL portion (e.g., on a semiconductor substrate). Similarly, transistors 817 and 819 electrically couple Word_Line_B 838 and bit lines (Bit_B 830 and Bit_B* 832) with cell 700 through vias 821 and 823. In the dual-ported structure, access to the cell 700 for data operations can be accomplished using one set of the word and bit lines for write operations and the other set of the word and bit lines for read operations. As one example, Word_Line_A 818 and bit lines Bit_A 810 and Bit_A* 812 can be used for read operations to the cell 700, such that Word_Line_A 818 is operative as a read word line and bit lines Bit_A 810 and Bit_A* 812 are operative as a pair or read bit lines. Similarly, Word_Line_B 838 and bit lines Bit_B 830 and Bit_B* 832 can be used for write operations to the cell 700, such that Word_Line_B 838 is operative as a write word line and bit lines Bit_B 830 and Bit_B* 832 are operative as a pair of write bit lines. Read and write data operations to the cell(s) 700 will be described in greater detail below. It should be noted that FIG. 8 depicts write operations with positive voltages. If negative voltages are used, then the write transistors would need to be bi-directional, such as a pass transistor, for example.

A write to cell 700 occurs by having the value of the data to be written determine which voltage is to be gated to each bit line. An address activates the word line turning on the cell transistors which pass the voltage to the memory cell 700. The polarity and magnitude of the voltage difference applied across the memory cell 700 will cause the memory cell 700 switch to a first resistance value or a second resistance valued (e.g., change conductivity profiles). It should be noted that that writing can occur with positive voltages, negative voltages, or the combination of positive and negative voltages and those voltages can be applied as a voltage pulse. If positive and negative voltages are used, it may be possible to eliminate or greatly reduce any charge pumps and related circuitry that may be required. If this is done, the gating transistors in each cell 700 may need to be changed to pass gates, allowing both polarities to be gated to the cell 700. Furthermore, a write enable would also have to be gated with the data value to be written. While positive and negative voltages are anticipated for some applications, a simpler design would be to select two voltages to act as the programming voltages (e.g., two positive voltage values), thereby reducing transistors and circuitry for data gating requirements. In other applications, the higher voltages required for two positive voltages may not be allowed based on process limitations and the more complex positive and negative method may be required.

Figure 9:
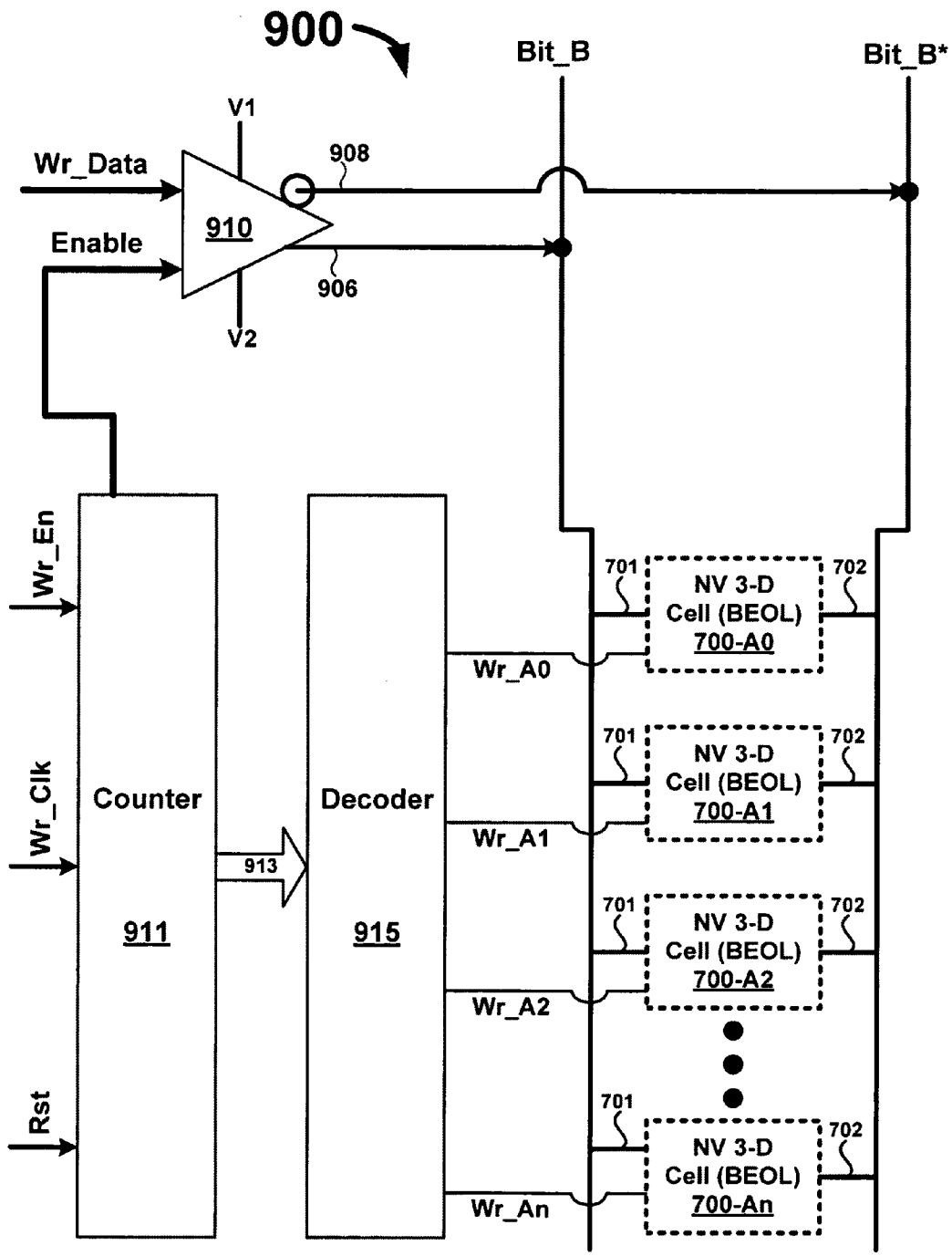
FIG. 9 depicts a schematic of a write path for a non-volatile FIFO.
Figure 10:
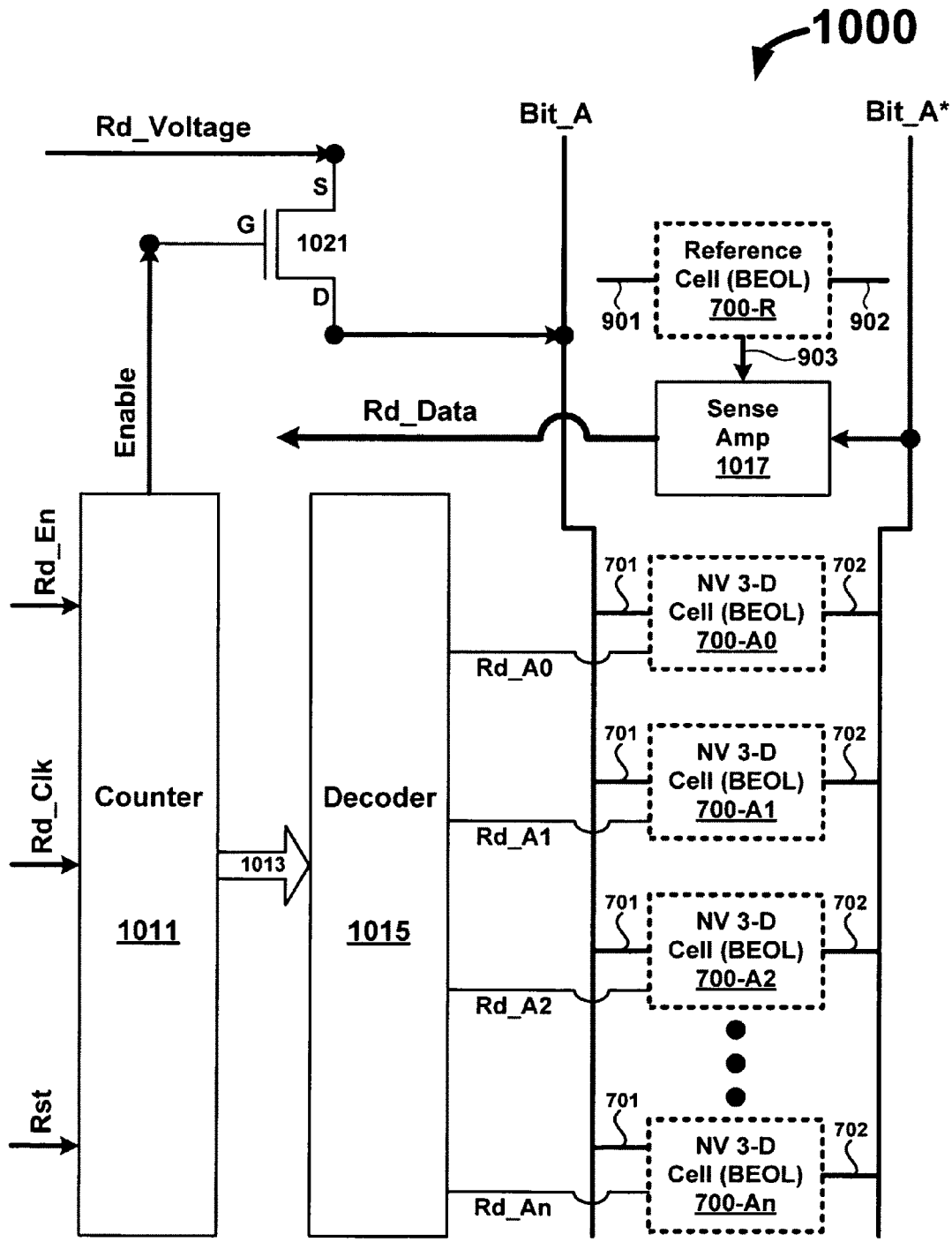
FIG. 10 depicts a schematic of a read path for a non-volatile FIFO.

Attention is now directed to FIG. 9, where a write path 900 includes a write voltage source 910 electrically coupled with voltages V1 and V2 and operative to apply write voltage potentials to bit lines Bit_B and Bit_B* in response to signals for write data Wr_Data and Enable. A counter 911 can generate the signal Enable in response to the write enable signal Wr_En going active. In response to a write clock Wr_Clk, the counter 911 generates an address 913 that is electrically coupled with a decoder 915 that decodes the address (e.g., the count) and activates a write word line (Wr_A0, Wr_A1, Wr_A2, . . . Wr_An) based on the address 913. The voltages applied to bit lines Bit_B and Bit_B* are non-identical voltages operative to change the conductivity profile of the memory cell 700 selected by decoder 915 via word lines (Wr_A0, Wr_A1, Wr_A2, . . . Wr_An). For example, a voltage on output 906 applied to Bit_B can be opposite in polarity to a voltage on output 908 applied to Bit_B*. Furthermore, the magnitudes of the voltages on outputs 906 and 908 need not be identical. The magnitude and polarities of the voltages on outputs 906 and 908 are determined by the value of the write data Wr_Data. As one example, if the value of Wr_Data is a logic "0", then a voltage potential of +3V can be applied by output 906 on Bit_B and a voltage potential of −3V can be applied by output 908 on Bit_B* to program the selected cell 700 to a high resistance state indicative of the logic "0" value of Wr_Data. As another example, if the value of Wr_Data is a logic "1", then a voltage potential of −2V can be applied by output 906 on Bit_B and a voltage potential of +4V can be applied by output 908 on Bit_B* to program the selected cell 700 to a low resistance state indicative of the logic "1" value of the Wr_Data.

FIG. 10 depicts circuitry for a read path 1000 using the non-volatile third dimensional memory cells 700. The non-volatile third dimensional memory cells 700 are accessed by having the word line (e.g., Rd_A0, Rd_A1, Rd_A2, . . . Rd_An) turn on the transistors to a selected cell 700. A read voltage is applied on one of the bit lines (Bit_A, Bit_A*). The application of the read voltage produces an output voltage or output current on the opposite bit line that is indicative of the value of data stored in the selected cell 700. The bit line passes the value to a sense amplifier 1017 that compares the value to a reference value 903. The reference value 903 can be selected to be approximately half the difference between two values of data (e.g., a high resistance and a low resistance) that can be stored in the memory cells 700, allowing the sense amplifier 1017 to easily determine which state the memory cell 700 is presently in. In read path 1000, counter 1011 receives a read enable signal Rd_En and a read clock signal Rd_Clk and generates an address 1013. Decoder 1015 receives the address 1013 and activates a read word line (Rd_A0, Rd_A1, Rd_A2, . . . Rd_An) based on the address 1013 (e.g., the count).

For example, if a memory cell 700 in a programmed state has a resistance of ≈1.5MΩ that is indicative of a logic "0" being stored in the memory cell 700 and the cell 700 in an erased state has a resistance of ≈150 kΩ that is indicative of a logic "1" being stored in the memory cell 700, then the resistance for the reference value can be selected to be approximately 820 kΩ. In some applications the reference value 903 can be generated by a reference memory cell 700-R that can be fabricated BEOL along with the memory cells 700. The reference memory cell 700-R can be electrically coupled with FEOL circuitry operative to apply write voltages for setting the reference resistance value (e.g., ≈820 kΩ) of the reference memory cell 700-R. The reference resistance value can be set by applying voltages of the appropriate magnitude and polarity across the two terminals (901, 902) of the cell 700-R. The structure of the reference memory cell 700-R can be identical to or substantially identical to the structure for the memory cells 700. To prevent data stored in a memory cell 700 from being overwritten or corrupted during a read operation, a magnitude of the read voltage is less than the magnitude(s) of the write voltage. For example, if the magnitude of the write voltage is 4V, then the magnitude of the read voltage can be 2V. The read voltage can be uni-polar, bi-polar, and can be applied as a voltage pulse.

Although FIGS. 9 and 10 depict the memory cells 700 for the NV-FIFO as directly connected with the word lines and bit lines, the FEOL transistors and connections described in regards to FIG. 8 are not depicted in FIGS. 9 and 10 to simplify explanation of the write and read paths. Accordingly, the word lines for read and write are electrically coupled with the gate (G) terminals of their respective transistor pairs and the bit lines for read and write are electrically coupled with the source (S) and drain (D) terminals of their respective transistors.

Figure 11:
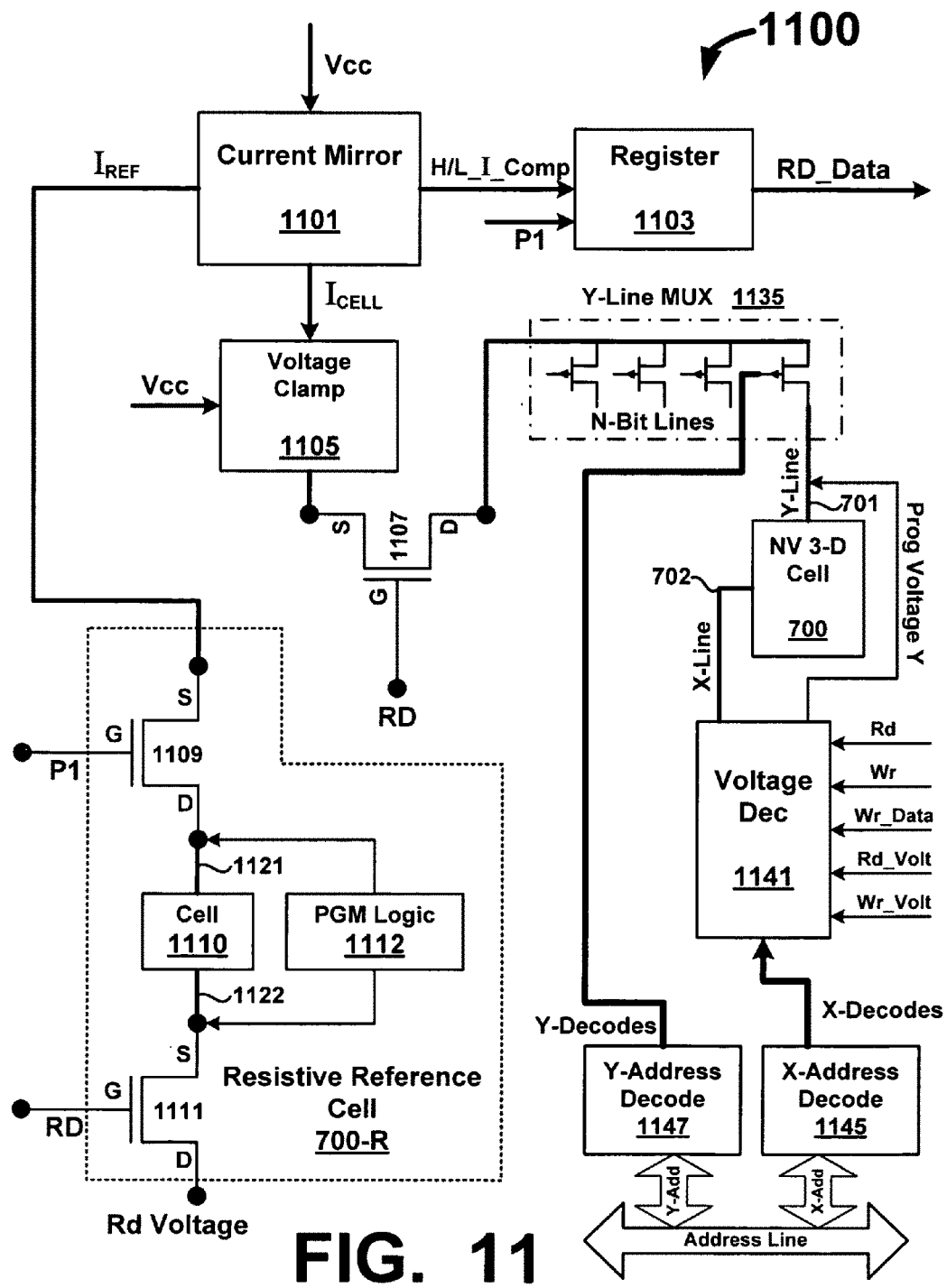
FIG. 11 depicts a schematic for current domain read architecture for a non-volatile FIFO.
Figure 12:
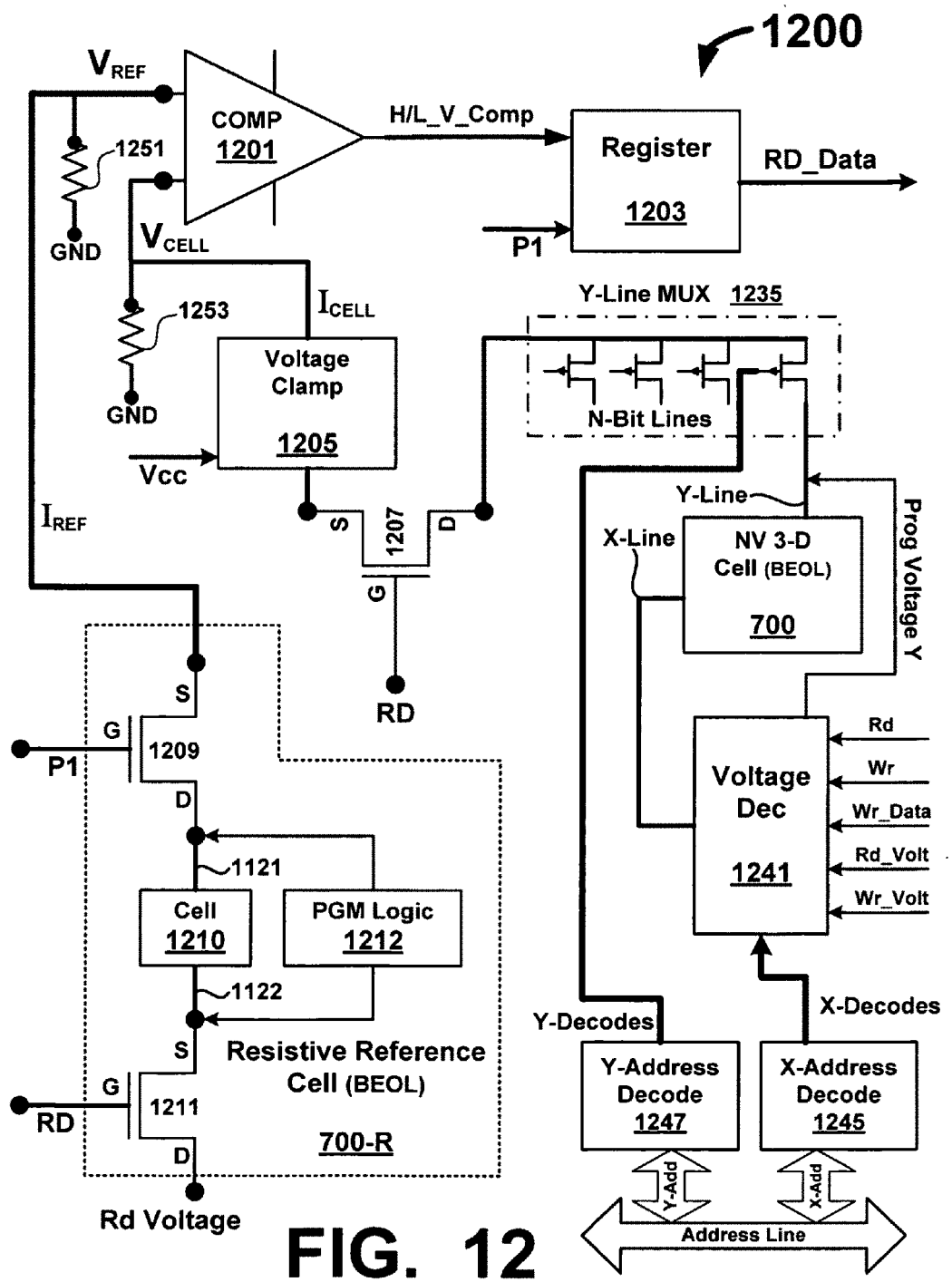
FIG. 12 depicts a schematic for voltage domain read architecture for a non-volatile FIFO.

Reading data can be accomplished in a variety of ways including but not limited to sensing the value of read data in the current domain or in the voltage domain. Current domain sensing is depicted in FIG. 11; whereas, voltage domain sensing is depicted in FIG. 12. Referring now to FIG. 11, a current domain configuration 1100 includes a current mirror circuit 1101 that receives a read current $I_{CELL}$ and a reference current $I_{REF}$ as inputs and outputs mirrored versions of those currents to an IN converter (not shown) where the magnitudes of the mirrored currents are converted to voltages that are input to a voltage comparator that outputs a signal H/L_I_Comp that is indicative of the value of the stored data in the memory cell 700. For example, the signal H/L_I_Comp can be a low voltage (e.g., ≈0.3V) for a logic "0" and a higher voltage (e.g., ≈2.5V) for a logic "1". A register 1103 or the like, can store the output from the current mirror 1101 in response to a signal P1 and output the stored data as read data RD_Data. The reference current $I_{REF}$ is generated by resistive reference cell 700-R that includes a cell 1110 that can be identical to the cell 700, programming logic 1112 operative to program the cell 1110 to an appropriate predetermined value as was described above, and transistors 1109 and 1111 operative to apply a voltage (e.g., a read voltage) across terminals 1121 and 1122 of the cell 1110 to generate the reference current $I_{REF}$.

In FIG. 12, a voltage domain configuration includes circuitry similar that of FIG. 11; however, instead of a using a current mirror and IN converters, configuration 1200 includes a voltage comparator 1201 operative to compare a reference voltage $V_{REF}$ with a cell voltage $V_{CELL}$ and those voltages are generated by currents $I_{REF}$ and $I_{CELL}$ respectively by voltage drops on resistors 1251 and 1253. Comparator 1201 outputs a signal H/L_V_Comp which is coupled with register 1203 that outputs the signal as RD_Data.

In an application where power to a FIFO is cycled on and off, the address pointers for the FIFO and registers for counters can be configured as non-volatile registers, such as the aforementioned non-volatile third dimensional memory cells 700, so that data stored in the registers (e.g., pointers and counter values) is not lost when power is removed and FIFO operation can resume with accurate stored data values when power is restored. Therefore, an NV-FIFO can include storage elements configured for operation as non-volatile registers in addition to the non-volatile memory cells 700 for data storage to ensure that data necessary for proper operation of the NV-FIFO is retained after power down and the data is available when power is restored to the NV-FIFO. Therefore, the BEOL portion of an integrated circuit that implements a NV-FIFO can include memory cells 700 configured as registers for counters, ring counters, pointers, or for other FIFO system functions. For example, FEOL counter circuitry can be electrically coupled with BEOL memory cells configured for non-volatile register operation. Those non-volatile registers can be used to store any non-volatile data for operation of the NV-FIFO. Other FEOL components of the NV-FIFO can be electrically coupled with BEOL non-volatile registers for non-volatile storage of data required by those components.

Figure 13:
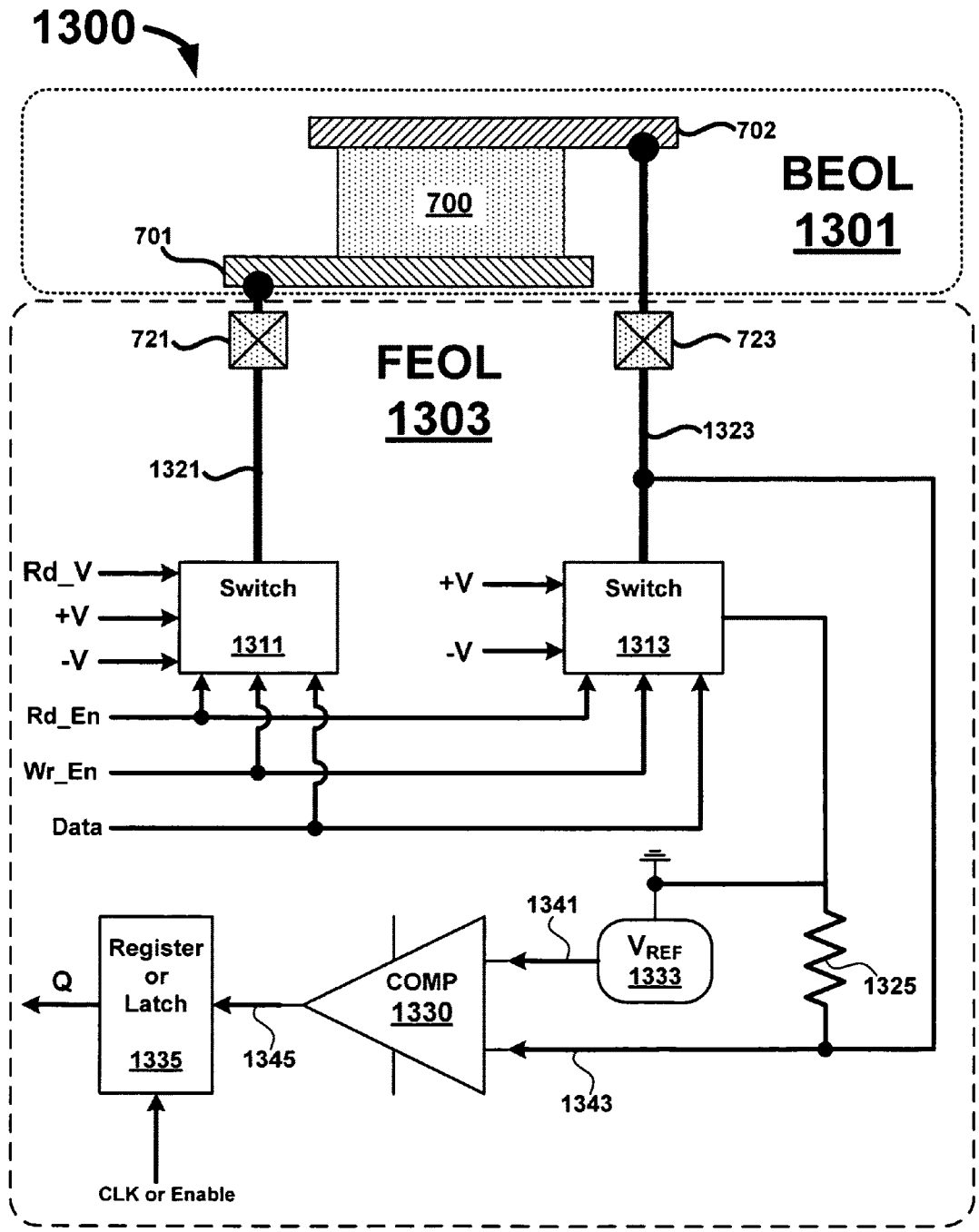
FIG. 13 depicts a schematic for a BEOL non-volatile register and FEOL access circuitry.

FIG. 13 depicts a configuration 1300 including a non-volatile third dimensional memory cell 700 that can be used to implement a non-volatile register for pointers, counters, or any other purpose requiring non-volatile storage of data to support operation of a NV-FIFO in which data needs to be retained due to power cycling. The non-volatile third dimensional memory cell 700 is fabricated BEOL 1301 above circuitry that is fabricated FEOL 1303 and configured to perform data operations on the cell 700. As described above the FEOL 1303 portion can be fabricated on a substrate such as a silicon wafer and the BEOL 1301 portion can be subsequently fabricated over the FEOL 1303 portion. The other memory cells 700 depicted in FIGS. 7-12 can also be fabricated BEOL 1301 along with the cells 700 configured for use as non-volatile registers. Signals from circuitry formed FEOL 1301 are electrically coupled with the terminals 701 and 702 of the cell 700 using vias 721 and 723 as previously described above. Switches 1311 and 1313 are operative to apply voltages across the cell 700 to write data to the cell 700 during write operations (e.g., Wr_En is active) and to read data from the cell 700 during read operations (e.g., when Rd_En is active). A comparator 1330 compares a signal 1343 from the cell 700 with a signal 1341 from a voltage reference 1333 and generates an output 1345 that can be stored in a register or latch 1335. In some applications, the voltage reference can be replaced by one or more of the aforementioned resistive reference cells 700-R. A comparator of the like can compare a signal from the resistive reference cells 700-R with other signals (e.g., current from cell 700) in the current or voltage domains to derive the value of data stored in the cell 700.

Figure 14:
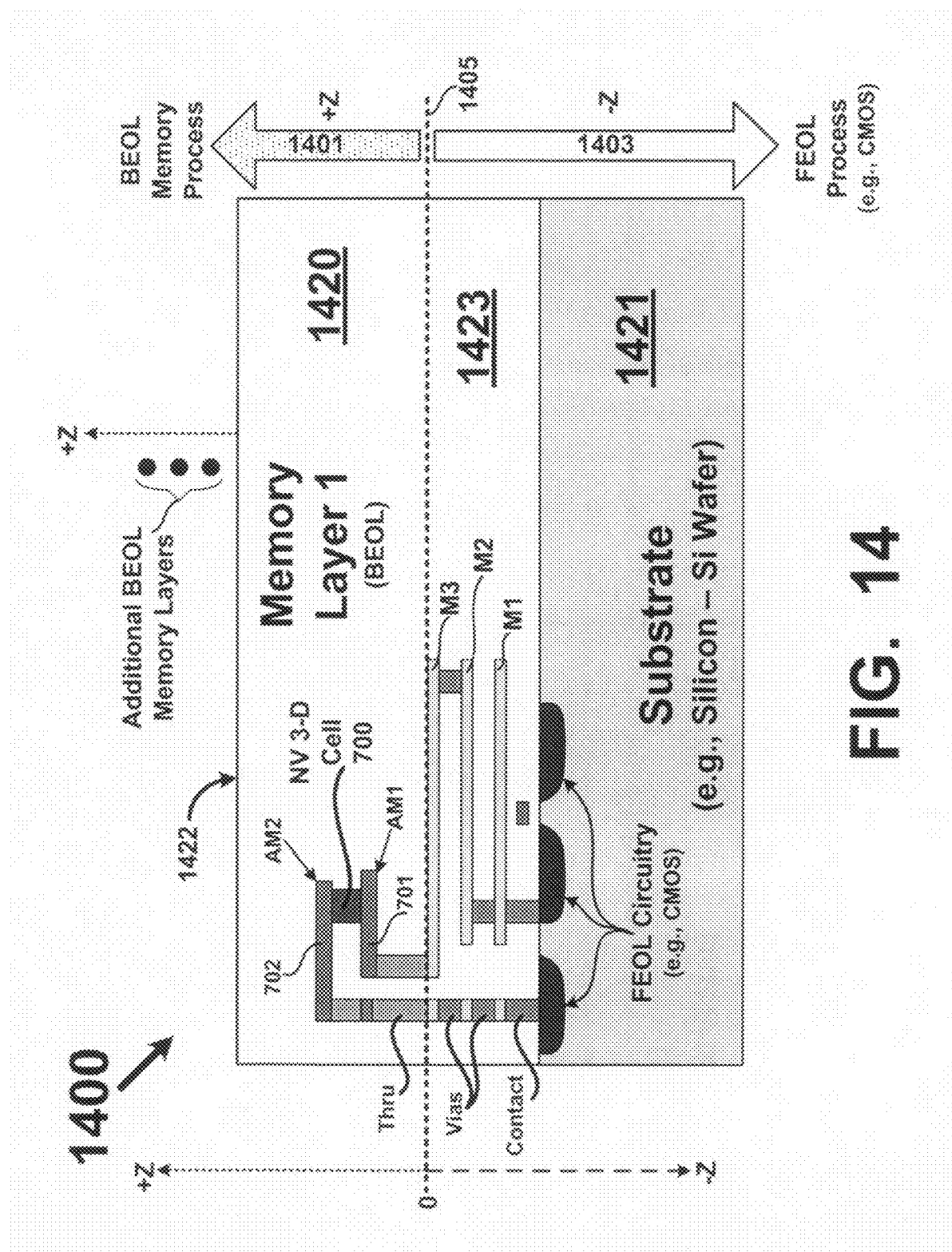
FIG. 14 depicts a cross-sectional view of an integrated circuit including a BEOL non-volatile memory cell, FEOL circuitry, and FEOL interconnect structure.

Moving on to FIG. 14, a cross sectional view of an integrated circuit (IC) 1400 with the non-volatile third dimensional memory cell 700 vertically stacked 1420 above logic circuits 1421 and an interconnect structure 1423 in the third dimension (e.g., along a +Z axis) is depicted. Here, Memory Layer 1 and any additional memory layers (e.g., memory layers fabricated along the +Z axis above surface 1422) are fabricated BEOL 1401 above the circuitry 1421 and interconnect structure 1423 that are fabricated FEOL 1403 (e.g., along a −Z axis). Dashed line 1405 depicts an approximate demarcation (e.g., 0 origin of the Z-axis) between the FEOL 1403 and BEOL 1401 portions of the IC 1400. The FEOL 1403 portion can include a substrate (e.g., a silicon wafer) upon which the circuitry is fabricated (e.g., CMOS circuitry) and metal layers M1, M2, M3, vias, and contacts for electrically coupling the circuitry with the cell 700. Although one cell 700 is depicted, the Memory Layer 1 can include a plurality of the memory cells 700 as necessary to implement a NV-FIFO and those memory cells 700 can be configured in a two-terminal cross-point array. In Memory Layer 1, as part of the BEOL fabrication process, electrically conductive structures such as thrus, contacts, and conductive array lines can be fabricated to electrically couple the BEOL fabricated cell(s) 700 with the aforementioned electrically conductive structures in the interconnect structure 1423. For example, array metal layer 1 (AM1) can be an X-direction conductive array line (e.g., a row line) and array metal layer 2 (AM2) can be a Y-direction conductive array line (e.g., a column line), and those conductive array lines can electrically couple with the terminals 701 and 702 of the cell 700.

The design of the NV-FIFO can be used as a design block in an ASIC design environment. The logic can be compiled or dropped in as a hard coded design block. The device could be fabricated using a standard CMOS FEOL process and then the NV memory cells 700 can be added BEOL with a few additional steps, in a standard fab or in a special fab dedicated to processing the BEOL portion. By adding this NV-FIFO along with other types of memory blocks (e.g., third dimensional non-volatile memory that emulates DRAM, SRAM, and/or FLASH), an ASIC can be designed to be fully capable of power cycling without data loss in the NV-FIFO or the other memory types.

The foregoing examples have been described in some detail for purposes of clarity of understanding, but are not limited to the details provided. There are many alternative ways and techniques for implementation. The disclosed examples are illustrative and not restrictive.

What is claimed is:
1. A non-volatile FIFO, comprising:
   a front-end-of-the-line (FEOL) portion including a substrate, the substrate including active circuitry and an interconnect structure, at least a portion of the active circuitry and interconnect structure are configured for FIFO data operations; and a back-end-of-the-line (BEOL) portion in contact with the FEOL portion and fabricated above and positioned above the FEOL portion, the BEOL portion including a plurality of two-terminal non-volatile memory cells configured to store data as a plurality of conductivity profiles that are retained in the absence of power, the interconnect structure and the active circuitry operative to electrically couple each memory cell with a write word line, a read word line, a pair of write bit lines, and a pair of read bit lines, the BEOL portion further including at least one two-terminal non-volatile resistive reference cell operative to generate a reference signal during a read operation, wherein data is written to each memory cell by enabling the write word line connected with the memory cell and applying a write voltage across the pair of write bit lines connected with the memory cell, and wherein data is read from each memory cell by enabling the read word line connected with the memory cell and applying a read voltage across the pair of read bit lines connected with the memory cell.

2. The non-volatile FIFO of claim 1, wherein each memory cell includes a two-terminal memory element that is electrically in series with the terminals of the memory cell.

3. The non-volatile FIFO of claim 1, wherein the active circuitry further comprises a counter electrically coupled with at least one enable signal and at least one clock signal, the counter operative to generate an address signal when the at least one enable signal and the at least one clock signal are active, a decoder electrically coupled with the address signal, the decoder operative during a read operation to activate the read word line for the memory cell selected by the address, the decoder operative during a write operation to activate the write word line for the memory cell selected by the address, write circuitry operative during the write operation to apply a write voltage across the pair of write bit lines, the write voltage having a magnitude and polarity determined by a value of data to be written to the memory cell selected by the address, and read circuitry operative during the read operation to apply a read voltage across the pair of read bit lines, the read voltage operative to generate a read current in the memory cell selected by the address and a magnitude of the read current is indicative of a value of data stored in the memory cell selected by the address.

4. The non-volatile FIFO of claim 3, wherein the counter includes a plurality of non-volatile registers positioned in the BEOL portion and operative to retain counter data in the absence of power, and each non-volatile register including at least one two-terminal non-volatile memory cell configured to store the counter data.

5. The non-volatile FIFO of claim 3, wherein the counter comprises a ring counter.

6. The non-volatile FIFO of claim 5, wherein the ring counter includes a plurality of non-volatile registers positioned in the BEOL portion and operative to retain ring counter data in the absence of power, and each non-volatile register including at least one two-terminal non-volatile memory cell configured to store the ring counter data.

7. The non-volatile FIFO of claim 1 wherein the at least one two-terminal non-volatile resistive reference cell includes a structure that is identical to a structure of the plurality of two-terminal non-volatile memory cells.

8. The non-volatile FIFO of claim 1, wherein the plurality of two-terminal non-volatile memory cells are positioned in at least one two-terminal cross-point memory array.

9. The non-volatile FIFO of claim 8, wherein a write operation on the at least one two-terminal cross-point memory array does not require an erase operation prior to the write operation.

10. The non-volatile FIFO of claim 8, wherein at least a portion of the at least one two-terminal cross-point memory array is configured for use as a non-volatile register.

11. The non-volatile FIFO of claim 8, wherein the active circuitry is configured to emulate, in at least a portion of the at least one two-terminal cross-point memory array, at least one memory type selected from the group consisting of DRAM, SRAM, and FLASH.

12. The non-volatile FIFO of claim 1, wherein the plurality of two-terminal non-volatile memory cells are positioned in a plurality of two-terminal cross-point memory arrays and one or more of the plurality of two-terminal cross-point memory arrays are positioned in a plurality of vertically stacked memory planes.

13. The non-volatile FIFO of claim 12, wherein the two-terminal non-volatile memory cells positioned in one of the plurality of vertically stacked memory planes share conductive array lines with the two-terminal non-volatile memory cells positioned in an adjacent one of the plurality of vertically stacked memory planes.

14. The non-volatile FIFO of claim 12, wherein a write operation on one or more of the plurality of two-terminal cross-point memory arrays does not require an erase operation prior to the write operation.

15. The non-volatile FIFO of claim 12, wherein at least a portion of one or more of the plurality of two-terminal cross-point memory arrays is configured for use as a non-volatile register.

16. The non-volatile FIFO of claim 12, wherein the active circuitry is configured to emulate, in at least a portion of one or more of the plurality of two-terminal cross-point memory arrays, at least one memory type selected from the group consisting of DRAM, SRAM, and FLASH.

17. The non-volatile FIFO of claim 1, wherein the active circuitry is configured to emulate at least one memory type selected from the group consisting of DRAM, SRAM, and FLASH.

18. The non-volatile FIFO of claim 1, wherein a write operation on one or more of the plurality of two-terminal non-volatile memory cells does not require an erase operation prior to the write operation.

19. The non-volatile FIFO of claim 1 and further comprising:

an integrated circuit that includes the FEOL portion and the BEOL portion.

* * * * *